United States Patent
Ebihara et al.

(10) Patent No.: US 6,249,186 B1
(45) Date of Patent: *Jun. 19, 2001

(54) HIGH-FREQUENCY POWER AMPLIFIER CIRCUIT AND HIGH-FREQUENCY POWER AMPLIFIER MODULE

(75) Inventors: Hitoshi Ebihara; Masaki Naganuma; Masanobu Kaneko; Fumitaka Iizuka, all of Tokyo (JP)

(73) Assignee: Taiyo Yuden Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,558

(22) Filed: Apr. 9, 1999

(30) Foreign Application Priority Data

Apr. 10, 1998 (JP) .................................................. 10-099053

(51) Int. Cl.$^7$ ........................................................ H03F 3/16
(52) U.S. Cl. ............................ 330/277; 330/302; 330/310
(58) Field of Search .................................... 330/277, 286, 330/302, 306, 307, 310, 311

(56) References Cited

U.S. PATENT DOCUMENTS

| | | | |
|---|---|---|---|
| 4,342,967 | * 8/1982 | Regan et al. | 330/277 |
| 5,051,706 | * 9/1991 | Zushi | 330/277 |
| 5,146,178 | * 9/1992 | Nojima et al. | 330/277 |
| 5,202,649 | * 4/1993 | Kashiwa | 330/277 |
| 5,250,912 | * 10/1993 | Fujita | 330/277 |
| 5,276,406 | * 1/1994 | Samay et al. | 330/302 |
| 5,339,047 | * 8/1994 | Mizan et al. | 330/306 |
| 5,412,347 | * 5/1995 | Minnis | 330/286 |
| 5,942,943 | * 8/1999 | Matsuno | 330/277 |
| 6,054,902 | * 4/2000 | Masato | 330/306 |

FOREIGN PATENT DOCUMENTS

| | | |
|---|---|---|
| 5-315855 | 11/1993 | (JP) . |
| 7-202585 | 8/1995 | (JP) . |
| 8-335836 | 12/1996 | (JP) . |
| 9-162657 | 6/1997 | (JP) . |
| 9-199956 | 7/1997 | (JP) . |

* cited by examiner

Primary Examiner—Robert Pascal
Assistant Examiner—Khanh Van Nguyen
(74) Attorney, Agent, or Firm—Lowe Hauptman Gilman & Berner, LLP

(57) ABSTRACT

An input matching circuit is provided having the output impedance-frequency characteristics wherein the output impedance shows a value approximately equal to that of the gate input impedance of the FET at the frequency of the objective signal to be amplified, and the output impedance shows a value not more than twice the gate input impedance of the FET at least at the entire frequencies from the frequency of the objective signal to be amplified through twice the frequency of the objective signal to be amplified so that the matching between the input previous stage circuit and the gate of the FET can be secured. Thereby, a high-frequency power amplifier circuit and a high-frequency power amplifier module, which can suppress the occurrence of distortion, perform stably, and get miniaturized, are configured.

34 Claims, 13 Drawing Sheets

*Fig.* 4
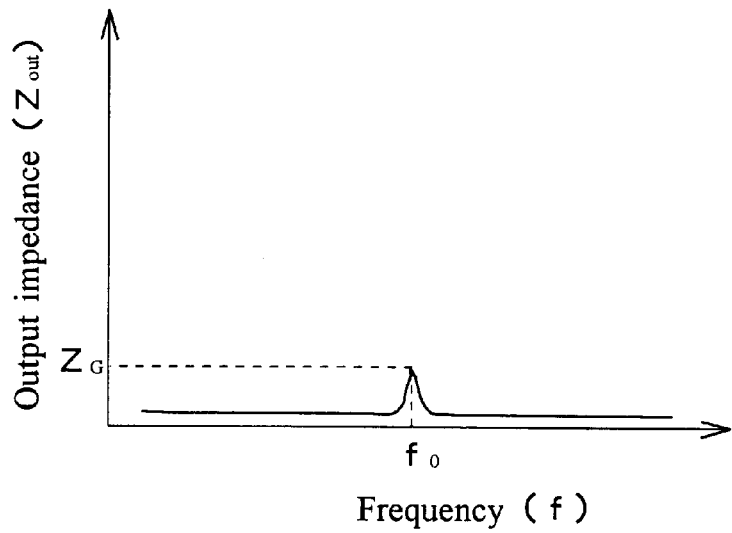
*Fig.* 5
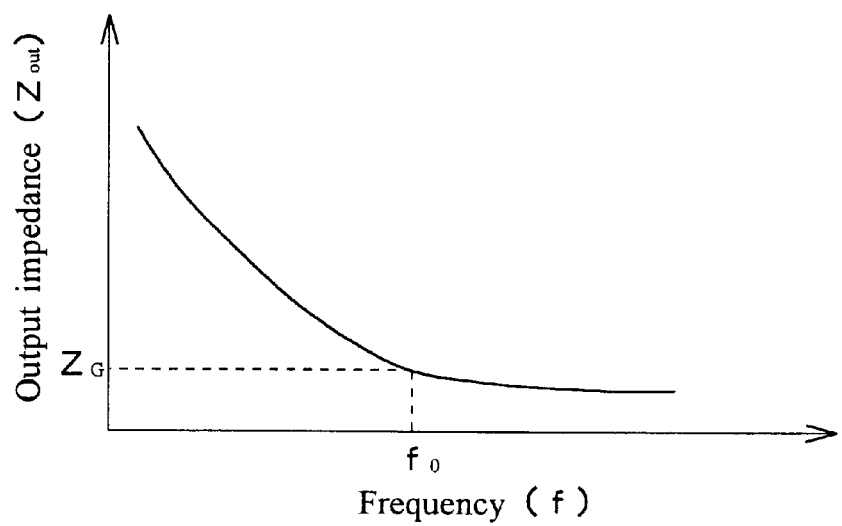

*Fig.* 6
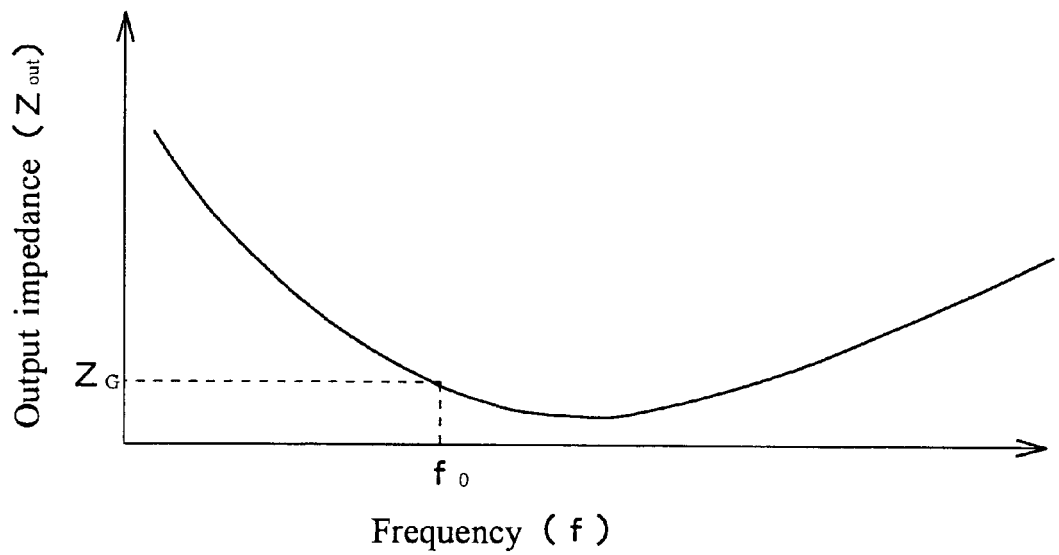
*Fig.* 7
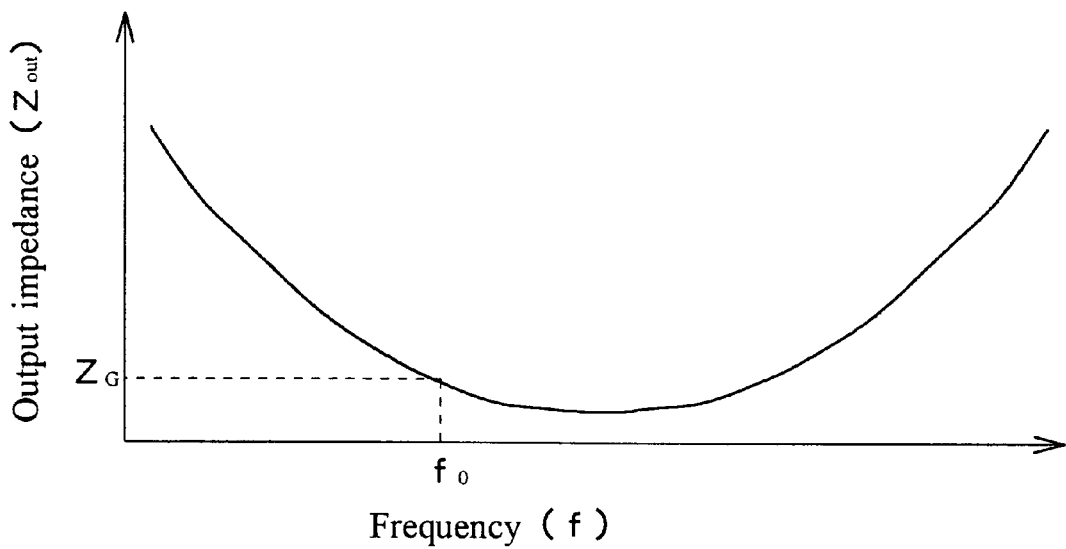

|  | C 1 | L 1 | L 2 |
|---|---|---|---|
| Conventional example | 9. 6 p F | 2. 4 n H | — |
| First example | 1 8. 0 p F | 1. 0 n H | 0. 5 n H |
| Secon example | 1 2. 5 p F | 1. 5 n H | 1. 0 n H |
| Third example | 1 0. 0 p F | 2. 0 n H | 2. 0 n H |

|  | C1 | L1 | L2 |
|---|---|---|---|
| Conventiona example | 10.2pF | 2.8nH | — |
| First example | 15.5pF | 1.3nH | 0.5nH |
| Second example | 11.0pF | 2.0nH | 1.0nH |
| Comparative example | 0.5pF | 2.5nH | 2.0nH |

HIGH-FREQUENCY POWER AMPLIFIER CIRCUIT AND HIGH-FREQUENCY POWER AMPLIFIER MODULE

BACKGROUND OF THE INVENTION

1. Field of the Invention

The present invention relates to a high-frequency power amplifier circuit and a high-frequency power amplifier module which are used in a micro-wave communication devices, etc.

2. Description of the Prior Art

In recent years the communication technology involving high frequencies has been progressing, and handy communication devices using high frequencies are proliferating rapidly. Accordingly, miniaturization of the handy communication devices is being longed for.

Conventionally, high-frequency power amplifier modules are in much use where a field effect transistor (hereinafter referred to as FET) is used in the high-frequency power amplifier part for such handy high-frequency communication devices.

The above-described high-frequency power amplifier module has become commercially available as a module where a high-frequency power amplifier circuit is formed on a ceramic substrate having an area for example of around 10 mm by 10 mm. As a module circuit of this kind, the high-frequency power amplifier circuit as shown in FIG. 2 is generally used. That circuit consists of an input matching circuit 23 provided between the signal input terminal 21 and the gate of FET 22, an output matching circuit 24 which is provided between the drain of FET 22 and the output terminal 27, and a drain bias circuit 25 of FET 22, etc.

However, with the above-described high-frequency power amplifier circuit there was a problem that the frequency component of an input signal together with its higher harmonic component is supplied to the gate of FET 22 so that the waveform of the output signal would have become distorted and thus its performance would not be stable.

For the purpose of solving this problem, as for the high-frequency power amplifier circuit disclosed in Japanese Patent Application Laid-Open No. 9-162657, a high-frequency power amplifier circuit suppressing an occurrence of distortion is proposed by way of short-circuiting only the second higher harmonic component of frequency in the input signal which affects the distortion much with the following configurations to be added.

(1) A transmission line having a length of approximately one eighth of the wavelength of an input signal with one end getting opened is to be connected to the gate of FET.

(2) A transmission line having a length of approximately a quarter of the wavelength of an input signal with one end getting harmonically grounded is to be connected to the gate of FET.

(3) one end of a series resonance circuit comprising an inductor and a capacitor in series together with the resonance frequency being approximately twice as that of the input signals are to be connected to the gate of FET. Furthermore, the other end of that series resonance circuit is to be grounded.

(4) A first transmission line and a second transmission line with respective one ends getting opened are to be connected to the gate of FET. Furthermore, either the first transmission line or second transmission line has a length of approximately one eighth of the wavelength of an input signal having a frequency at a lowest limit and the other has a length of approximately one eighth of the wavelength of an input signal having a frequency at an uppermost limit.

(5) One end each of a first as well as a second transmission line is harmonically grounded at the gate of FET. Furthermore, either the first transmission line or second transmission line has a length of approximately a quarter of the wavelength of an input signal having a frequency at a lowest limit and the other has a length of approximately a quarter of the wavelength of an input signal having a frequency at an uppermost limit.

(6) one end each of a first series resonance circuit and a second series resonance circuit comprising an inductor and a capacitor in series is to be connected to the gate of FET, and the respective other ends are to be grounded. Moreover, either one of resonance frequencies of the first series resonance circuit or the second series resonance circuit is made approximately twice the wavelength of an input signal having a frequency at a lowest limit and the other has a length of approximately twice the wavelength of an input signal having a frequency at an uppermost limit.

However, the following problems existed in forming a transmission or resonance circuit for purpose of eliminating distortion in the high-frequency power amplifier circuit:

(a) The length of the transmission line requires at least one eighth of the wavelength of the input signal. Due to this, miniaturization is hampered when the high-frequency power amplifier circuit is configured as a module.

For example, the length of transmission line will become approximately 12.5 mm when the high-frequency power amplifier circuit with the frequency of the input signal being 1 GHz is formed on an alumina substrate ($\epsilon=9.6$). Therefore, it becomes difficult to proceed with formation onto a substrate of the aforementioned conventional example, and thus the demand for the miniaturization cannot be complied with.

(b) A plurality of resonance circuits must be provided for applicability to a plurality of higher harmonic components since it is necessary to set up resonance frequencies of the resonance circuit so as to correspond with respective higher harmonic wave of input signal frequencies. Moreover, the miniaturization of a circuit and a device is hampered since also for noise component other than higher harmonic component resonance circuits must be provided respectively.

BRIEF SUMMARY OF THE INVENTION

The purpose of the present invention is to provide a high-frequency power amplifier circuit and a high-frequency power amplifier module which suppress the occurrence of distortion to stabilize their performance and can be miniaturized.

The high-frequency power amplifier circuit of the present invention comprises a field effect transistor, a matching circuit which is provided lying between the gate of the field effect transistor and the input terminal to secure the matching between the output impedance of the previous stage circuit to be connected to the input terminal and the gate input impedance of the field effect transistor, and in the high-frequency power amplifier circuit amplifying and outputting a determined frequency of the objective signal to be amplified, which was inputted from the previous stage circuit, a matching circuit has been provided having the output impedance-frequency characteristics wherein the output impedance showed a value approximately equal to that of the gate input impedance of the field effect transistor at the frequency of the objective signal to be amplified, and the output impedance showed a value not more than twice the gate input impedance at least at the entire frequencies from the frequency of the objective signal to be amplified through twice the frequency of the objective signal to be amplified.

In the high-frequency power amplifier circuit of the present invention, for the objective signals to be amplified and outputted from the previous stage circuit, the input impedance of a matching circuit becomes approximately equal to the output impedance of the previous stage circuit and the output impedance of the matching circuit becomes approximately equal to gate input impedance of the field effect transistor. Thus, the objective signals to be amplified are put into the gate in a matching state without causing any attenuation, etc., so as to be output after being amplified by the field effect transistor.

On the other hand, it is always the case that the noise current including the second higher harmonic current which has occurred in the previous stage circuit other than the objective signals to be amplified or in the matching circuit is a small current as compared with the current of the objective signals to be amplified.

Here, as for the input matching circuit in the conventional example, as shown in FIG. 3, its output impedance-frequency characteristics had a feature showing the gate input impedance ($Z_G$) at the frequency for objective signals to be amplified ($f_o$), where as the frequency (f) increases, the output impedance ($Z_{out}$) of the matching circuit also increases.

The input matching circuit having such output impedance-frequency characteristics is a kind of low band pass type filter circuit having impedance-frequency characteristics that the cut-off frequency cannot be specified, namely no sudden change occurs.

Therefore, in the matching circuit of the conventional example, for the noise current including the above-described second higher harmonic current, its output impedance ($Z_{out}$) is to reach not less than a few times as the gate input impedance ($Z_G$) so that, even if the noise current including the second higher harmonic current was a small current as compared with the objective signal current to be amplified, the gate voltage occurring by this noise current (=noise current x output impedance) will become too big to ignore against the voltage of the objective signals to be amplified, thus distortion will occur.

The present inventor configured a matching circuit with its output impedance ($Z_{out}$) showing an approximately same value as that of the gate input impedance ($Z_G$) as for frequency of the objective signals to be amplified and with the gate voltage occurring by the noise current showing impedance as low as possible as for frequencies other than this in order to decrease or remove the gate voltage occurring by the noise current including the second higher harmonic wave, and attained matching between the previous stage circuit and the gate of the field effect transistor with this matching circuit.

As a matching circuit in the high-frequency power amplifier circuit of the present invention, the matching circuit having the aforementioned output impedance-frequency characteristics can attain the purposes of the present invention. Ideal output impedance-frequency characteristics, as shown in FIG. 4 of this matching circuit, are to show the gate input impedance ($Z_G$) at the frequency of the objective signals to be amplified ($f_o$), and a value lower than the gate input impedance ($Z_G$) at a frequency other than this, or to leave the impedance value null when the gate direct bias is not necessary. Otherwise, for example, taking it into consideration that the noise component affecting distortion much is the second higher harmonic component, as shown in FIG. 5 through FIG. 7, a matching circuit having output impedance-frequency characteristics similar to that of a high pass type filter or a band pass type filter can achieve the similar effect. Thus the matching circuit having such a feature can decrease or get rid of the occurrence of gate voltage due to the second higher harmonic component of the objective signals to be amplified, and the occurrence of the gate voltage due to the noise component of the frequency higher than the objective signals to be amplified, both affecting occurrence of distortion much, and can obtain the similar effect.

The output impedance-frequency characteristics shown in FIG. 5 of the matching circuit show approximately the same impedance value as the gate input impedance ($Z_G$) at the frequency of the objective signals to be amplified ($f_o$). Moreover, for frequencies lower than the frequency of the objective signals to be amplified ($f_o$) the output impedance ($Z_{out}$) increases in accordance with decrease in frequency, and for frequencies higher than the frequency of the objective signals to be amplified ($f_o$) the output impedance ($Z_{out}$) decreases in accordance with increase in frequency.

In addition, the output impedance-frequency characteristics shown in FIG. 6 of the matching circuit show approximately the same impedance value as the gate input impedance ($Z_G$) at the frequency of the objective signals to be amplified ($f_o$), and for frequencies lower than the frequency of the objective signals to be amplified ($f_o$) the output impedance ($Z_{out}$) increases in accordance with decrease in frequency. Moreover, for frequencies higher than the frequency of the objective signals to be amplified ($f_o$) the output impedance ($Z_{out}$) decreases in accordance with increase in frequency and thereafter increases gradually.

In addition, the output impedance-frequency characteristics shown in FIG. 7 of the matching circuit show approximately the same impedance value as the gate input impedance ($Z_G$) at the frequency of the objective signals to be amplified ($f_o$), and for frequencies lower than the frequency of the objective signals to be amplified ($f_o$) the output impedance ($Z_{out}$) increases in accordance with decrease in frequency. Moreover, for frequencies higher than the frequency of the objective signals to be amplified ($f_o$) the output impedance ($Z_{out}$) decreases in accordance with increase in frequency and thereafter increases as a multidimensional function.

Among any one of the above-described features, the output impedance ($Z_{out}$) of the matching circuit preferably takes the value not more than twice the gate input impedance ($Z_G$) for the entire frequencies higher than the frequency of the objective signals to be amplified ($f_o$) and up to the determined frequency not less than the frequency of the second higher harmonic wave of the objective signals to be amplified ($f_o$). This is subject to a precondition that as described above, the noise current including the second higher harmonic wave is smaller than the current of the objective signals to be amplified, and the value also has been judged as preferable from the result of experiments.

In the high-frequency power amplifier circuit having the above-described matching circuit, the output impedance ($Z_{out}$) of the matching circuit shows the value not more than twice the gate input impedance ($Z_G$) at least for the noise component in the above-mentioned frequency band including the second higher harmonic wave of the objective signals to be amplified. Due to this, the gate voltage generated by these noise component currents is more largely reduced or removed than that in a conventional case, and therefore the noise component superposed on the objective signals to be amplified is largely reduced, and thus stable power amplifier with less distortion can be provided. Moreover, since the electric power to be consumed for amplifying the noise component decreases as compared with the conventional cases, excellent effects such as reduction of consumption power or increase in maximum output power, and increase in drain efficiency for amplifier, etc. are also shown.

In addition, in the present invention, the matching circuit was configured to comprise a first capacitor provided between an input terminal and the earth, a first inductor provided between an input terminal and the gate of a field effect transistor, and a second inductor provided between the gate and the earth. By adopting such a configuration, simplification of the circuit as well as miniaturization thereof when configured as a module was made possible.

Moreover, easiness for manufacturing was planned by configuring the above-mentioned second inductor with a strip line.

In addition, short-circuit prevention of DC bias current was planned with the second inductor grounded via a capacitor in the case where it is necessary to provide the gate of the field effect transistor with DC bias.

In addition, as for high-frequency power amplifier circuit especially requiring no matching circuit, a high-frequency power amplifier circuit having an inductive impedance circuit, which is connected to the field effect transistor and to between the gate of the field effect transistor and the earth, has been configured, wherein the inductive impedance has shown the quantity not more than twice the gate input impedance of the field effect transistor at least for a frequency band from the frequency of the objective signal to be amplified which is inputted to the gate of the field effect transistor to the frequency being twice of this frequency of the objective signal to be amplified.

With this configuration, similarly as aforementioned, the occurrence of gate voltage due to the second higher harmonic component of the objective signals to be amplified, and the occurrence of gate voltage due to the noise component of the frequency higher than the objective signals to be amplified, both affecting occurrence of distortion much, can decrease or can be removed, and thus the purpose of the present invention can be attained.

Moreover, the impedance-frequency characteristics of the above-described inductive impedance circuit were chosen to have the minimum point of impedance at the frequency which was not less than the frequency of the objective signals to be amplified and not more than twice of the frequency of the objective signals to be amplified. Due to this, at least the gate voltage generated by these noise component current in the above-mentioned frequency band including the second higher harmonic wave of the objective signals to be amplified is largely reduced or removed than that in a conventional case, and therefore the noise component piled upon the objective signals to be amplified is largely reduced, and thus stable power amplifier with less distortion can be provided. Moreover, since the electric power to be consumed for amplifying the noise component decreases compared with conventional cases, excellent effects such as reduction of consumption power or increase in maximum output power, and increase in drain efficiency for amplifier, etc. are also shown.

In addition, it goes without saying that, as described above, further to provision of an inductive impedance circuit, an impedance matching circuit between the previous stage circuit and the gate of field effect transistor may be provided. In this case, an impedance matching circuit including the above-described inductive impedance circuit may well be called an impedance matching circuit.

As for configurations of the above-described matching circuit and inductive impedance circuit, those skilled in the art will be able to create various circuit configurations using design technologies and the like on four-terminal network or filter circuit. Considering, however, that on this opportunity of describing the present invention, it is meaningless to refer to all of these possible circuit configurations, the description as for embodiments which would be easily understandable to those skilled in the art will be explained in detail as follows.

BRIEF DESCRIPTION OF THE DRAWINGS

FIG. 4 is a graph showing an ideal output impedance-frequency characteristics of a matching circuit in a high-frequency power amplifier circuit of the present invention;

FIG. 5 is a graph showing another example of output impedance-frequency characteristics of a matching circuit in a high-frequency power amplifier circuit of the present invention;

FIG. 6 is a graph showing another example of output impedance-frequency characteristics of a matching circuit in a high-frequency power amplifier circuit of the present invention;

FIG. 7 is a graph showing another example of output impedance-frequency characteristics of a matching circuit in a high-frequency power amplifier circuit of the present invention;

DETAILED DESCRIPTION

The present invention will be described further in detail with reference to the attached drawings.

Figure 1:
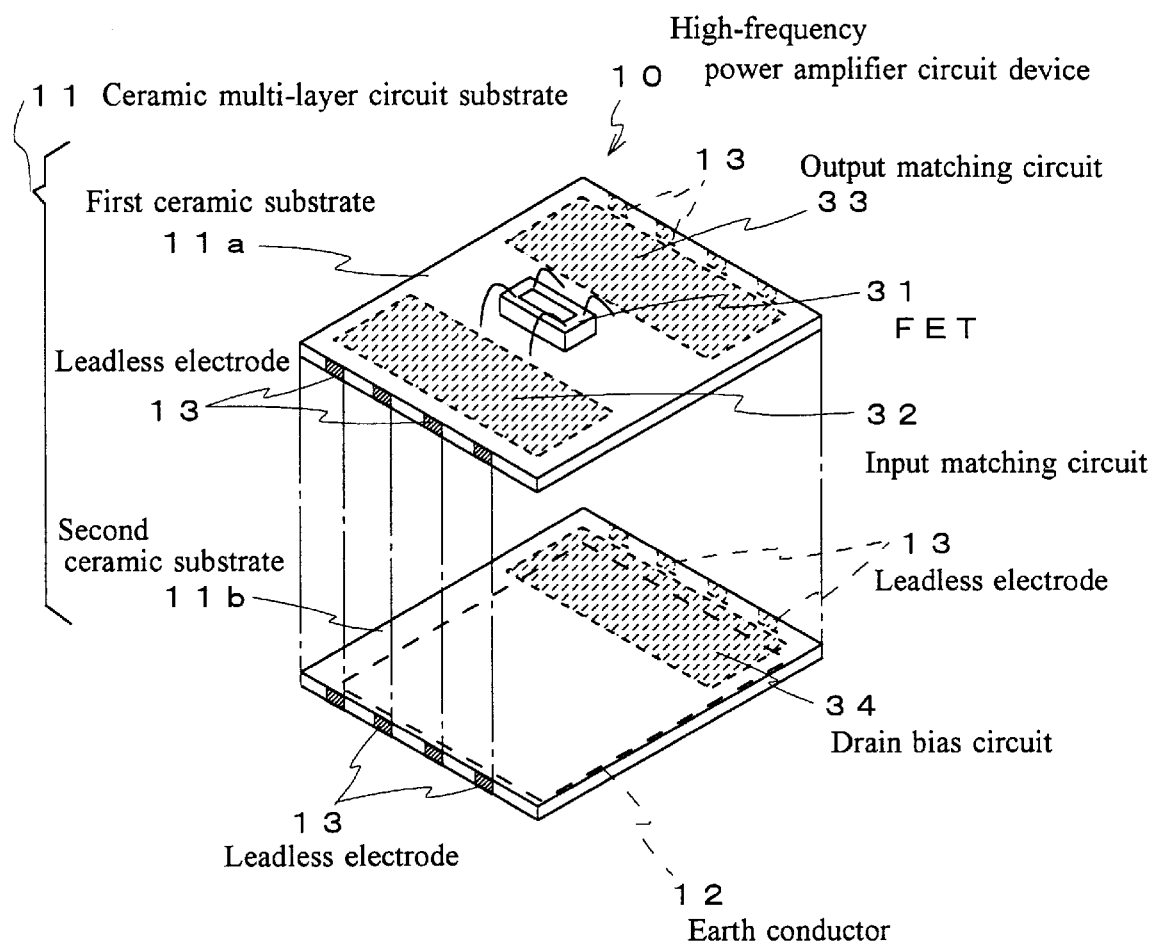
FIG. 1 is a schematic exploded perspective view showing a high-frequency power amplifier module of a first embodiment of the present invention.
Figure 2:
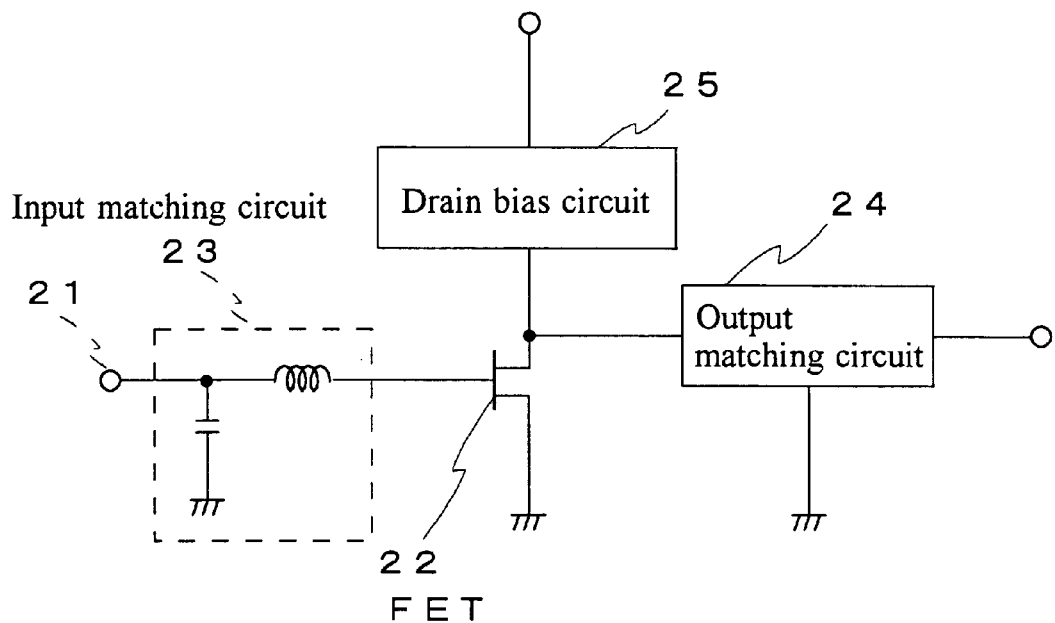
FIG. 2 is a circuit diagram showing a high-frequency power amplifier circuit of a conventional example.
Figure 3:
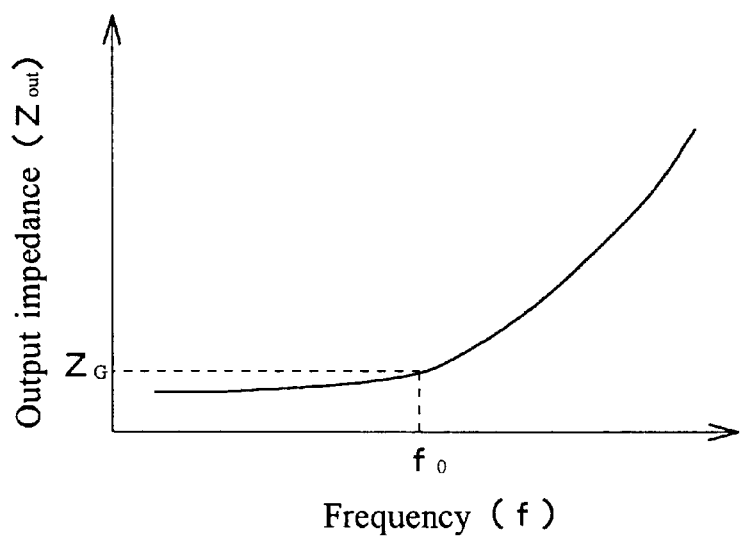
FIG. 3 is a graph showing the output impedance-frequency characteristics of input matching circuit in a conventional example.
Figures 8, 9:
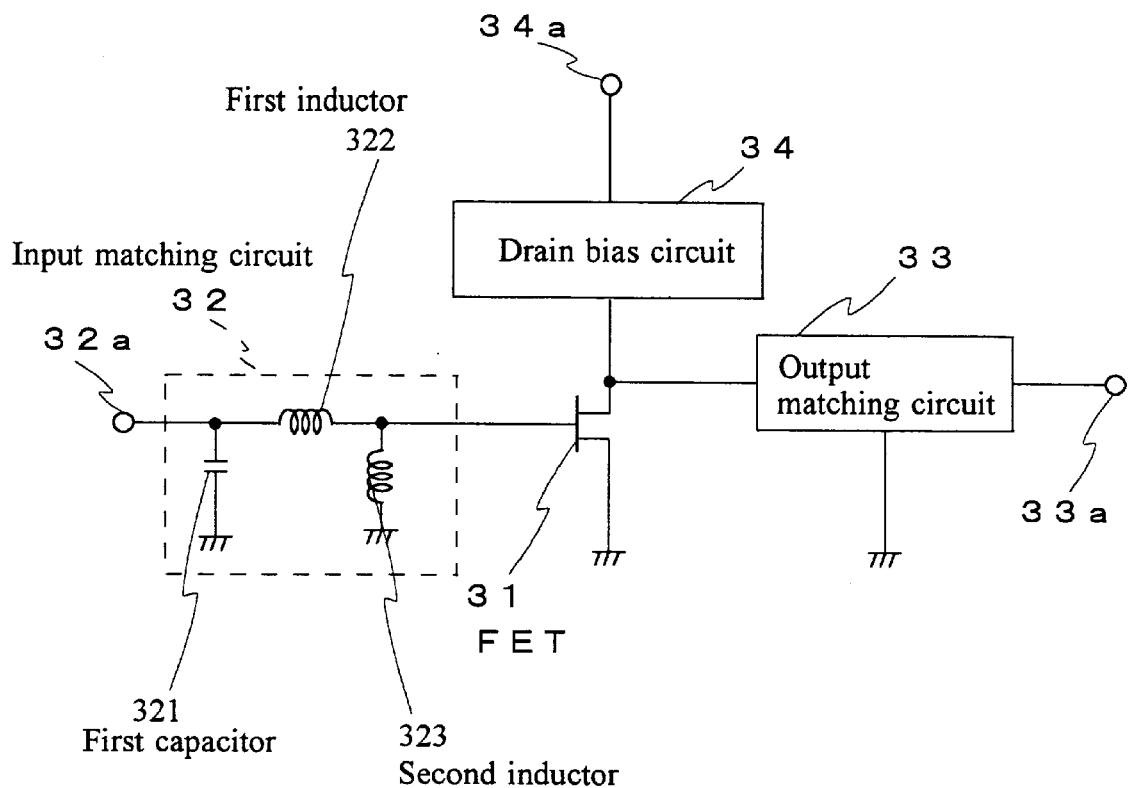
FIG. 8 is a circuit diagram showing a high-frequency power amplifier circuit of a first embodiment of the present invention.
FIG. 9 is a table showing specific circuit constants respectively of an input matching circuit in a conventional example and of an input matching circuit in the first embodiment of the present invention.

FIG. 1 is a schematic exploded perspective view showing a high-frequency power amplifier module of a first embodiment of the present invention and FIG. 8 is a circuit diagram showing a high-frequency power amplifier circuit of a first embodiment of the present invention.

In the present embodiment, a high-frequency amplifier circuit which amplifies and outputs high-frequency signals with 1 GHz frequency which was outputted from the not-shown previous stage circuit is described as an example. In addition, a high-frequency power amplifier module of the present embodiment is the one which was designed with output impedance of the previous stage circuit being 50Ω.

In FIG. 1, the high-frequency power amplifier module (hereinafter referred to as power amplifier module) is numbered as 10, and it is configured with a field effect transistor (hereinafter referred to as FET) 31 as well as other electronic parts being implemented on the upper surface of ceramic multi-layer circuit substrate (hereinafter referred to as multi-layer circuit substrate) 11.

The multi-layer circuit substrate 11 is configured with a first and a second ceramic substrate 11a and 11b made of such as alumina ($\epsilon$=9.6) being laminated. In addition, the size of the multi-layer substrate 11 is approximately 7.0 mm×7.0 mm with thickness of 0.8 mm. Incidentally, the alumina substrate may be substituted by a substrate made of resin.

FET 31 for power amplifier is implemented approximately at the center of the upper surface of a first ceramic substrate 11a which is provided in the upper layer. Moreover, FET 31 being constituted as a border, an input matching circuit 32 is formed at one side and an output matching circuit 33 is formed at the other side. Moreover, using a mounter, etc., chip parts (such as C, R, and L) are implemented on conductor wiring pattern formed on the upper surface of a first ceramic substrate 11a. In addition, FET 31, being a semiconductor chip, has been mounted with wire bonding or flip chip, etc.

Here, the conductor wiring pattern on the multi-layer circuit substrate 11 has been formed of copper (Cu), nevertheless, it may be formed using silver (Ag), silver palladium (AgPd), or silver platinum (AgPt).

On the other hand, on the upper surface of a second ceramic substrate 11b in the lower layer, a drain bias circuit 34 has been formed in the region overlapped with the position where the output matching circuit 33 has been formed. The drain of FET 31 is biased with electricity being applied via the drain bias circuit 34 from outside the device.

Moreover, a earth conductor 12 has been formed approximately all over the lower surface of the second ceramic substrate 11b, namely the bottom surface of the multi-layer circuit substrate 11, except for the peripheral portions.

By laminating these first and second ceramic substrate 11a and 11b, the multi-layer circuit substrate 11 having a drain bias circuit 34 formed within its internal layer has been configured.

In addition, at the side of the multi-layer circuit substrate 11, a plurality of leadless electrodes 13 have been provided. These leadless electrodes 13 are respectively configured to constitute an input terminal to input to the input matching circuit 32 the objective high-frequency signals to be amplified, an output terminal to output outward the signals subject to amplifier by the FET 31 and impedance matching by the output matching circuit 33, a power source terminal to connect the power source to the drain bias circuit 34, and earth terminal, corresponding with the planar implementation onto the parent circuit substrate.

Moreover, the upper surface of the multi-layer circuit substrate 11 has been covered with a metal case, which is not described in the drawing, and shielded by the metal case.

In addition, as shown in the circuit diagram in FIG. 8, the high-frequency signals which have been inputted to the input terminal 32a and are supposed to constitute the objective to be amplified are inputted to the gate of FET 31 via the input matching circuit 32.

The input matching circuit 32 secures the matching between impedance of the high-frequency signal source to be connected to the previous stage of the input terminal 32a, namely output impedance of the previous stage circuit, and the input impedance of the gate of the FET 31. In addition, the source of FET 31 has been grounded.

A drain power source terminal is numbered as 34a, and connected to the drain of the FET 31 via a drain bias circuit 34.

An output terminal, which terminal outputs the signals amplified by FET 31, is numbered as 33a and connected to the drain of the FET 31 via an output matching circuit 33.

Furthermore, the input matching circuit 32 is configured with a first capacitor 321, a first inductor 322, and a second inductor 323, and the first capacitor 321 is connected to between an input terminal 32a and the earth, and the first inductor 322 is connected to between the input terminal 32a and the gate of FET 31, and the second inductor 323 is connected to between the gate of FET 31 and the earth. Here, the gate input impedance ($Z_G$) of the FET 31 is 5Ω.

In addition, as for the input matching circuit 32, at the frequency of the objective signal to be amplified ($f_o$=1 GHz) the input impedance ($Z_{in}$) shows 50Ω, and the output impedance ($Z_{out}$) shows 5Ω. Moreover, as for the input matching circuit 32, the output impedance ($Z_{out}$) shows a value not more than twice the gate input impedance ($Z_G$) of the FET 31, namely a value not more than 10Ω, at the entire frequencies (except for the frequency of the objective signal to be amplified) from the frequency of the objective signal to be amplified ($f_o$=1 GHz) through twice the frequency of the objective signal to be amplified (2 GHz) in the frequency characteristics of the output impedance ($Z_{out}$).

Figure 10:
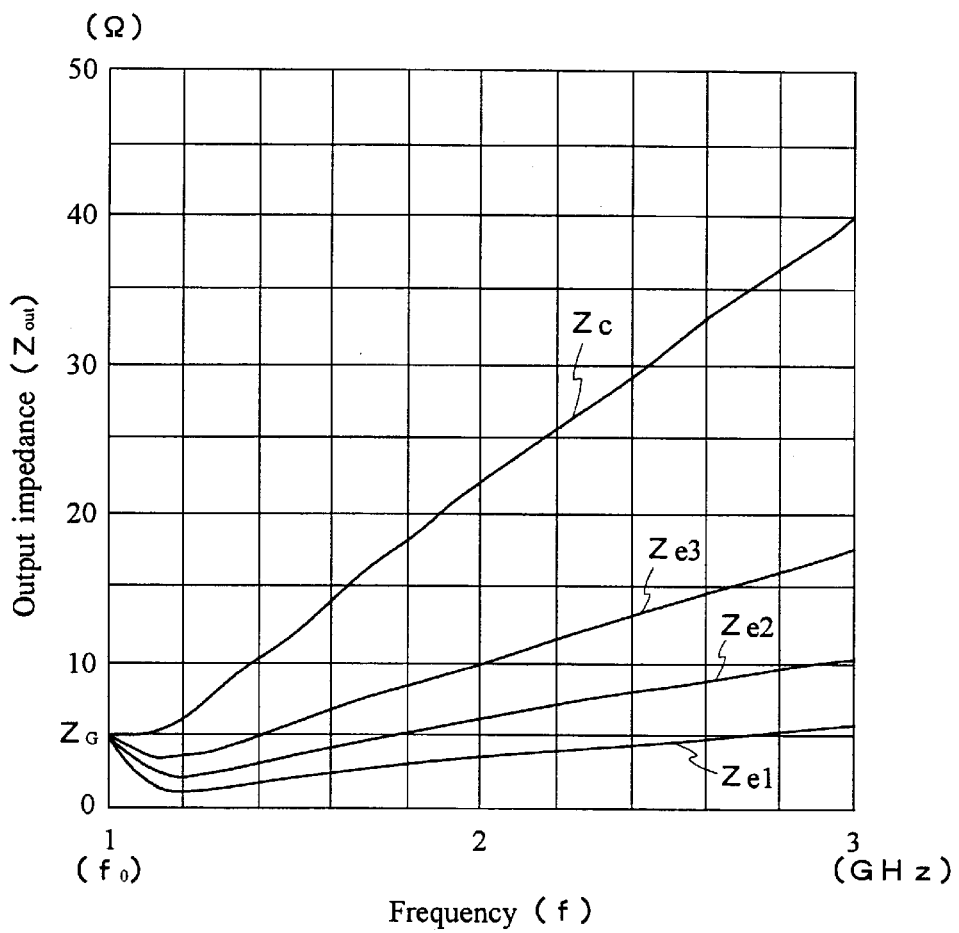
FIG. 10 is a graph showing the output impedance-frequency characteristics respectively of the input matching circuit in a conventional example and of the input matching circuit in the first embodiment of the present invention.

Here, the specific circuit constants of the input matching circuit in the conventional example as well as of the input matching circuit 32 in the present embodiment are shown in FIG. 9. Moreover, the output impedance-frequency characteristics of the matching circuit when these circuit constants were bound are shown in FIG. 10.

Incidentally, when a probe, etc., of a measuring device is connected with an actually formed power amplifier module 10, there will appear a strong influence of floating capacity as well as inductor, etc. due to the probe, accurate measurement is not feasible since the power amplifier module 10 is a circuit to treat high-frequency signals. Thus, the output impedance-frequency characteristics obtained by simulation are shown in FIG. 10.

Figure 11:
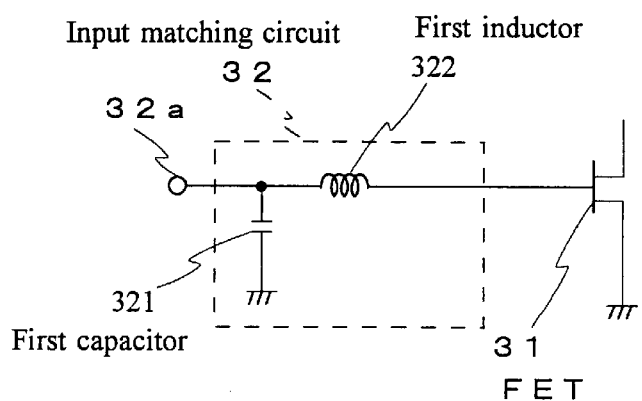
FIG. 11 is a circuit diagram showing an input matching circuit of a conventional example.

As for the conventional example, as shown in FIG. 11, a configuration excluded the second inductor 323, namely a matching circuit consisting of a first capacitor 321 and a first inductor 322 was given.

In addition, with C1 being the capacitance value of the first capacitor 321, L1 being the inductance value of the first inductor 322, and L2 being the inductance value of the second inductor 323, and as for the conventional example involving C1=9.6 pF, L1=2.4 nH, the matching between the not-shown previous stage circuit (output impedance: 50Ω) and the gate of the FET 31 (input impedance: 5Ω) was secured at the frequency of the objective signal to be amplified ($f_o$=1 GHz).

In addition, as for the first example of the present embodiment, C1=18.0 pF, L1=1.0 nH, and L2=0.5 nH were given. As for the second example, C1=12.5 pF, L1=1.5 nH, and L2=1.0 nH were given. In addition, as for the third example, C1=10.0 pF, L1=2.0 nH, and L2 =2.0 nH were given. Having these circuit constants given, the matching was secured at the frequency of the objective signal to be amplified ($f_o$=1 GHz) respectively.

The matching circuit of the conventional example having the above-mentioned circuit constants had output impedance-frequency characteristics shown as Zc curve in FIG. 10. That is, the output impedance ($Z_{out}$) is 5Ω at the frequency of the objective signal to be amplified ($f_o$=1 GHz), and as the signal frequency (f) increases, the output impedance ($Z_{out}$) increases linearly, presenting approximately 22Ω at 2 GHz and approximately 40Ω at 3 GHz.

In contrast therewith, the matching circuit 32 of the first example has output impedance-frequency characteristics shown as Ze1 curve in FIG. 10. That is, the output impedance ($Z_{out}$) is 5Ω at the frequency of the objective signal to be amplified ($f_o$=1 GHz), and at the neighborhood frequencies around 1 GHz, as the signal frequency (f) increases, the output impedance ($Z_{out}$) decreases, showing the minimum value (approximately 1Ω) at about 1.2 GHz, and thereafter, as the signal frequency increases, the output impedance ($Z_{out}$) increases approximately linearly, showing approximately 3Ω at 2 GHz and approximately 6Ω at 3 GHz.

The matching circuit 32 of the second example has output impedance-frequency characteristics shown as Ze2 curve in FIG. 10. That is, the output impedance ($Z_{out}$) is 5Ω at the frequency of the objective signal to be amplified ($f_o$=1 GHz) , and at the neighborhood frequencies around 1 GHz, as the signal frequency (f) increases, the output impedance ($Z_{out}$) decreases, showing the minimum value (approximately 2Ω) at about 1.2 GHz, and thereafter, as the signal frequency increases, the output impedance ($Z_{out}$) increases approximately linearly, showing approximately 6Ω at 2 GHz and approximately 11Ω at 3 GHz.

In addition, the matching circuit 32 of the third example has output impedance-frequency characteristics shown as Ze3 curve in FIG. 10. That is, the output impedance ($Z_{out}$) is 5Ω at the frequency of the objective signal to be amplified ($f_o$=1 GHz), and at the neighborhood frequencies around 1 GHz, as the signal frequency (f) increases, the output impedance ($Z_{out}$) decreases, showing the minimum value (approximately 1Ω) at about 1.2 GHz, and thereafter, as the signal frequency increases, the output impedance ($Z_{out}$) increases approximately linearly, showing approximately 10Ω at 2 GHz and approximately 17Ω at 3 GHz.

Next, an output signal waveform was surveyed when a sine wave signal at 1 GHz was inputted for amplifier respectively to a power amplifier module having a matching circuit of the above-mentioned conventional example and a power amplifier module having a matching circuit of the first example. The result of this measurement is shown in FIG. 12 and FIG. 13.

Figure 12:
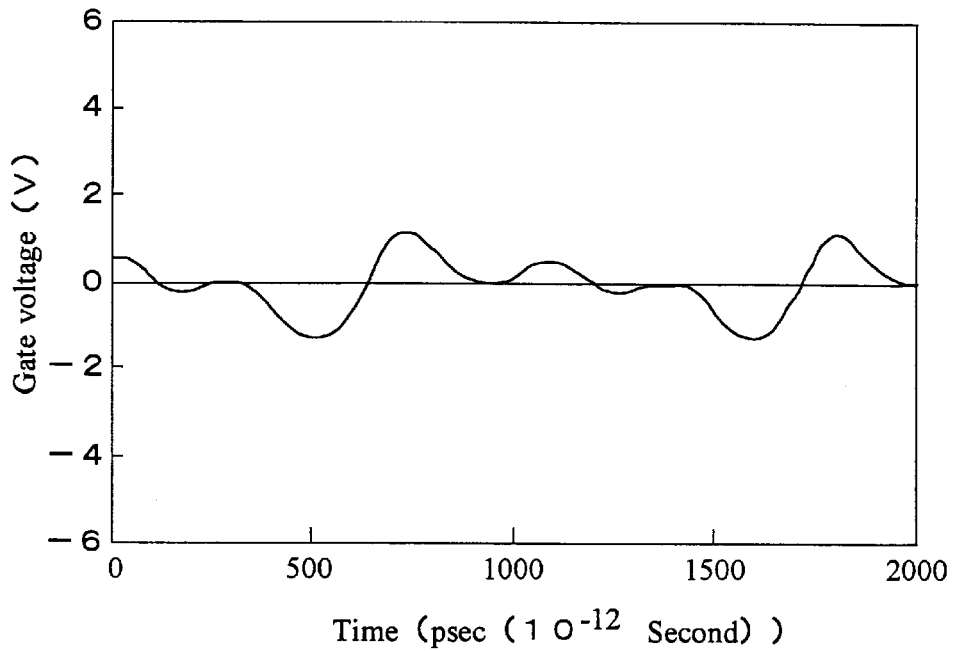
FIG. 12 is a graph showing an output waveform of a high-frequency power amplifier module comprising an input matching circuit of a conventional example.

FIG. 12 shows a waveform of an output signals when a matching circuit of a conventional example was used, the signal waveform being so distorted that it is impossible to distinguish it as a sine wave signal of 1 ns ($1 \times 10^{-9}$ second) cycle.

Figure 13:
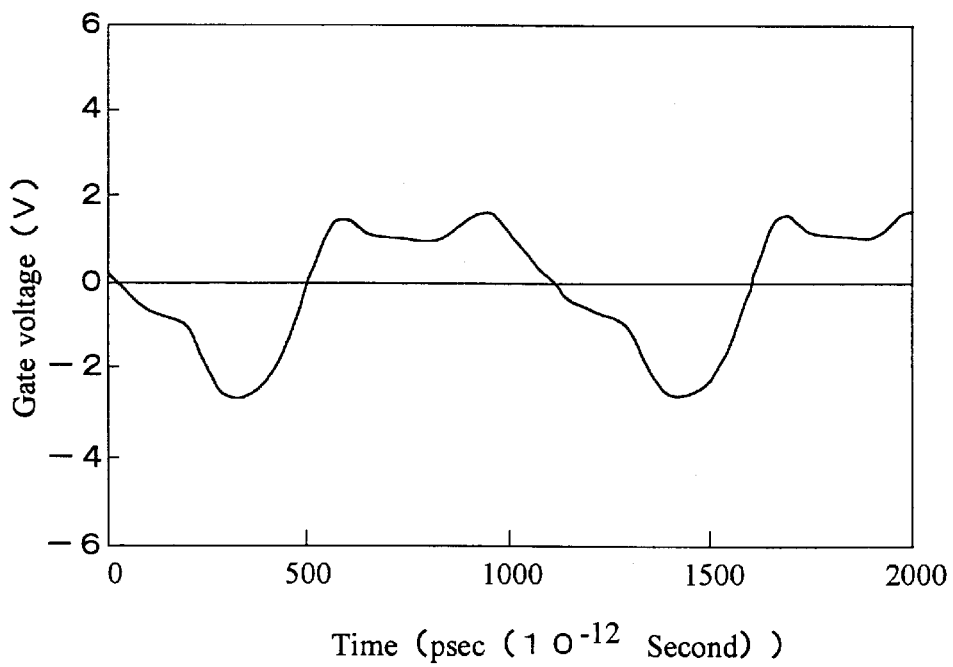
FIG. 13 is a graph showing an output waveform of a high-frequency power amplifier module comprising an input matching circuit of the present invention.

FIG. 13 shows a waveform of output signals when a matching circuit of a first example was used, and it was successfully confirmed that the signal waveform was sufficiently distinguishable as a sine wave signal of 1 ns ($1 \times 10^{-9}$ second) cycle in spite of its slight distortion, and the distortion was largely reduced compared with in the conventional example.

In addition, according to the matching circuit 32 of the present embodiment, as presumable from the above-described first through third examples, as the inductance values of the first and the second inductor 322, and 323 become smaller, a desired output impedance-frequency characteristics become more achievable. As a result hereof, in the case where these first and second inductors 322 and 323 are formed with strip lines, the length thereof may be made very short. Therefore, the circuit configuration may be sufficiently implemented also for the purpose of planning miniaturization of shape as well as high density in the high-frequency power amplifier module 10. For example, in the case where the second inductor 323 of the above-described first example was formed on an alumina substrate (ε=9.6) with strip lines, the length thereof was approximately 3.2 mm.

Incidentally, in the input matching circuit 32 in the above-described configuration, as the inductance values of the first and the second inductor 322, and 323 are made smaller, the capacity value of the first capacitor 321 increases, where the capacity value ranges around from 10 to several 10 pF, and the size thereof rarely changes also in the case where a chip-shaped capacitor is used.

As mentioned above, according to the power amplifier module 10 of the present embodiment, at the frequency of the objective signal to be amplified (1 GHz) having been output from the previous stage circuit, the input impedance of the input matching circuit 32 becomes approximately equal to the output impedance of the previous stage circuit. Moreover, the output impedance of the matching circuit 32 becomes approximately equal to the gate input impedance of the FET 31. Due to this, the objective signal to be amplified is input to the gate of the FET 31 in a well matched state without causing any attenuation, etc., and is amplified by FET 31 and is outputted.

Moreover, as for the input matching circuit 32, the output impedance ($Z_{out}$) shows the value not more than twice the gate input impedance ($Z_G$) of FET 31 for the entire frequencies from the frequency of the objective signals to be amplified to the frequency of the second higher harmonic wave of the objective signals to be amplified, thus the gate voltage occurring by these noise component current at least in the above-mentioned frequency band including the second higher harmonic wave of the objective signals to be amplified is more largely reduced than that in a conventional case, and therefore power amplifier with less distortion can be provided. Moreover, since the electric power to be consumed for amplifying the noise component decreases compared with conventional cases, excellent effects such as reduction of consumption power, increase in maximum output power, and increase in drain efficiency for amplifier, etc. are also shown.

In the present embodiment, as a high-frequency power amplifier module for PDC, a shape of 7.0 mm×7.0 mm×2.0 mm (including a metal case for shielding) and a volume of 0.1 cc was realized, being comparable to 1 W output power class, the characteristics of maximum output power of 32.5 dBm, and the drain efficiency of 72.7% were achieved, realizing compactness and high performance.

Figure 14:
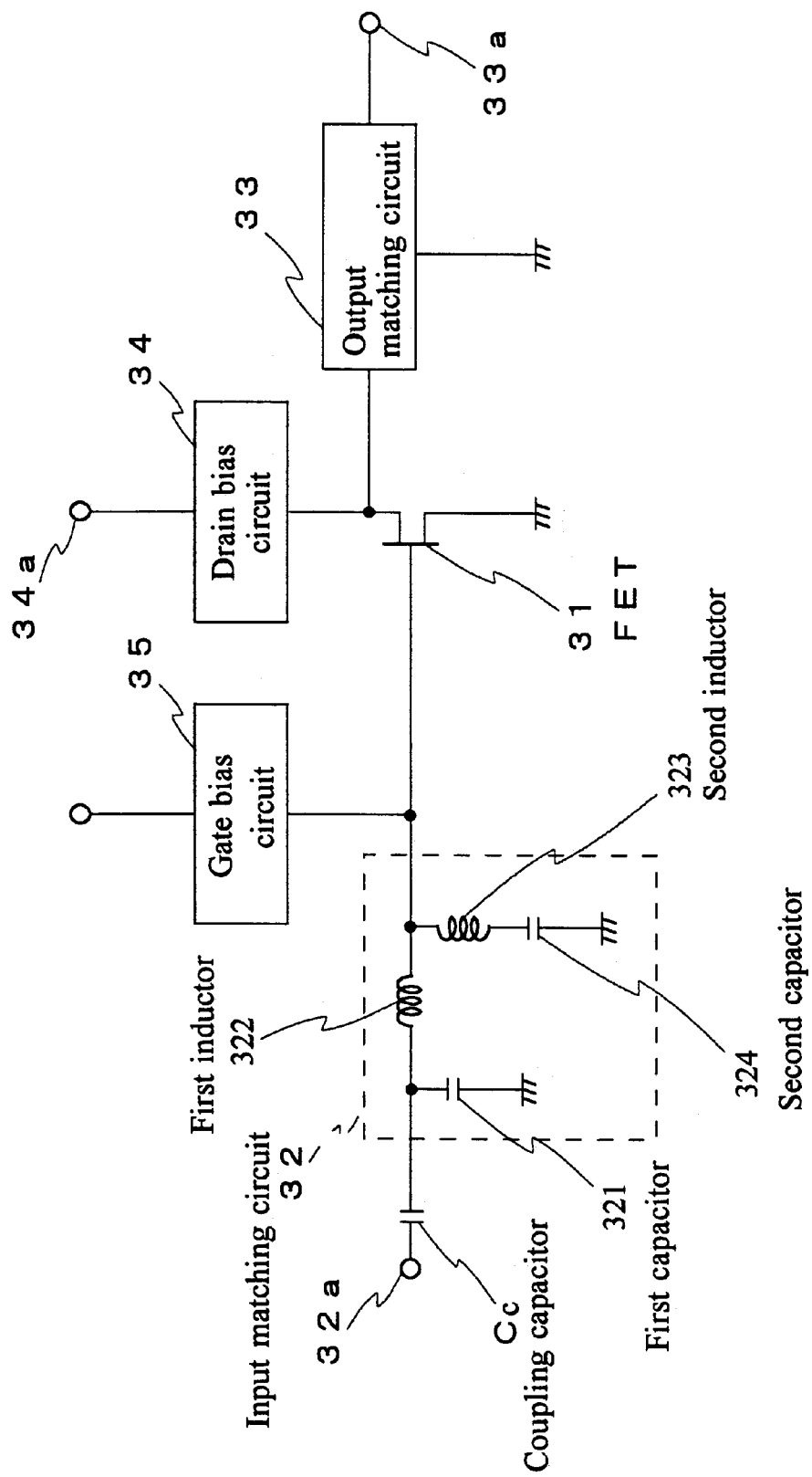
FIG. 14 is a circuit diagram showing a high-frequency power amplifier circuit of a second embodiment of the present invention.
Figures 15, 16:
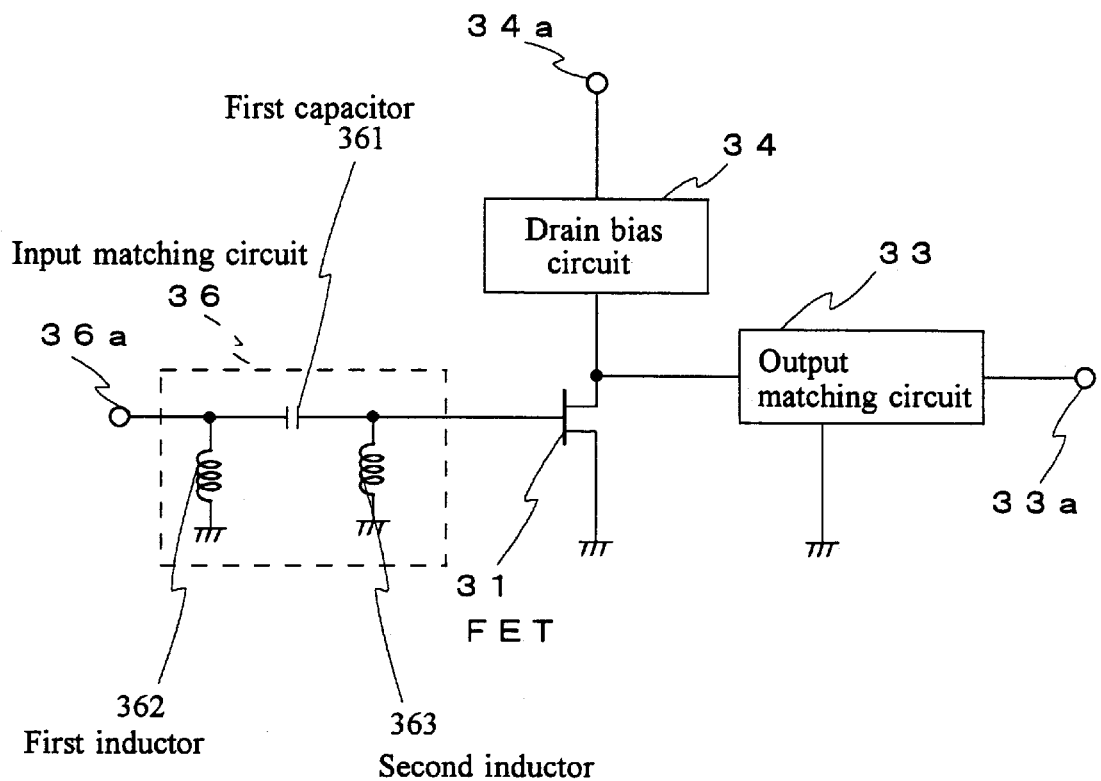
FIG. 15 is a circuit diagram showing a high-frequency power amplifier circuit of a third embodiment of the present invention.
FIG. 16 is a table showing specific circuit constants respectively of an input matching circuit in a conventional example as well as in a comparative example and of an input matching circuit in the third embodiment of the present invention.

Incidentally, when a gate bias circuit 35 is necessary with a coupling capacitor Cc to remove the direct current to be provided between the previous stage circuit and the module, a second embodiment may well be configured as shown in FIG. 14 and FIG. 15. That is, in the circuit configuration, the second capacitor 324 may well be provided between the second inductor 323 and the earth so that the direct bias current to be supplied from the gate bias circuit 35 to the gate of FET 31 as shown in FIG. 14 may not be short-circuited by the second inductor 323 of the input matching circuit 32. Also in this case, the circuit constants need to be fixed so that the output impedance-frequency characteristics of the input matching circuit 32 remain similar to the aforementioned.

Here, the second capacitor 324 is that to prevent the direct current component for the gate bias from being short-circuited, and with 100 pF, as for its capacity valve, which is being generally used for removing direct current, a sufficient effect was obtained.

Next, a third embodiment of the present invention is will be described.

FIG. 15 is a circuit diagram showing a high-frequency power amplifier circuit of a third embodiment. In the drawing the same codes represent the same configuring parts as in the first embodiment so that description thereof is omitted. Here, the appearance as well as configuration of the module, which is the same as in the aforementioned first embodiment, is omitted. In addition, the difference between the first embodiment and the third embodiment consists in the arrangement that while in the first embodiment the input matching circuit in the conventional example used to be a low band pass type filter and was improved involving extensive innovations, and thus the output impedance-frequency characteristics were made to fit to desired characteristics, in the third embodiment the input matching circuit consisting of high band pass type filter was improved and thus its output impedance-frequency characteristics were made to fit to desired characteristics.

That is, as shown in FIG. 15, the objective high-frequency signal to be amplified which was put in to the input terminal 36a is put in to the gate of FET 31 via the input matching circuit 36.

The input matching circuit 36 secures matching between impedance of the high-frequency signal source to be connected to the previous stage of the input terminal 36a, namely output impedance of the previous stage circuit, and the input impedance of the gate of the FET 31, and is configured with a first capacitor 361, a first inductor 362, and a second inductor 363, and the first capacitor 361 is connected to between an input terminal 36a and the gate of FET 31, and the first inductor 362 is connected to between the input terminal 36a and the earth, and the second inductor 363 is connected to between the gate of FET 31 and the earth. Here, the gate input impedance ($Z_G$) of the FET 31 is 5Ω.

Moreover, as for the input matching circuit 36, at the frequency of the objective signal to be amplified ($f_o$=1 GHz) the input impedance ($Z_{in}$) shows 50Ω, and the output impedance ($Z_{out}$) shows 5Ω, and at the same time the output impedance ($Z_G$) shows a value not more than twice the gate input impedance ($Z_G$) of the FET 31, namely a value not more than 10Ω, at the entire frequencies (except for the frequency of the objective signal to be amplified) from the frequency of the objective signal to be amplified ($f_o$=1 GHz) through twice the frequency of the objective signal to be amplified (2 GHz) in the frequency characteristics of the output impedance ($Z_{out}$).

Figure 17:
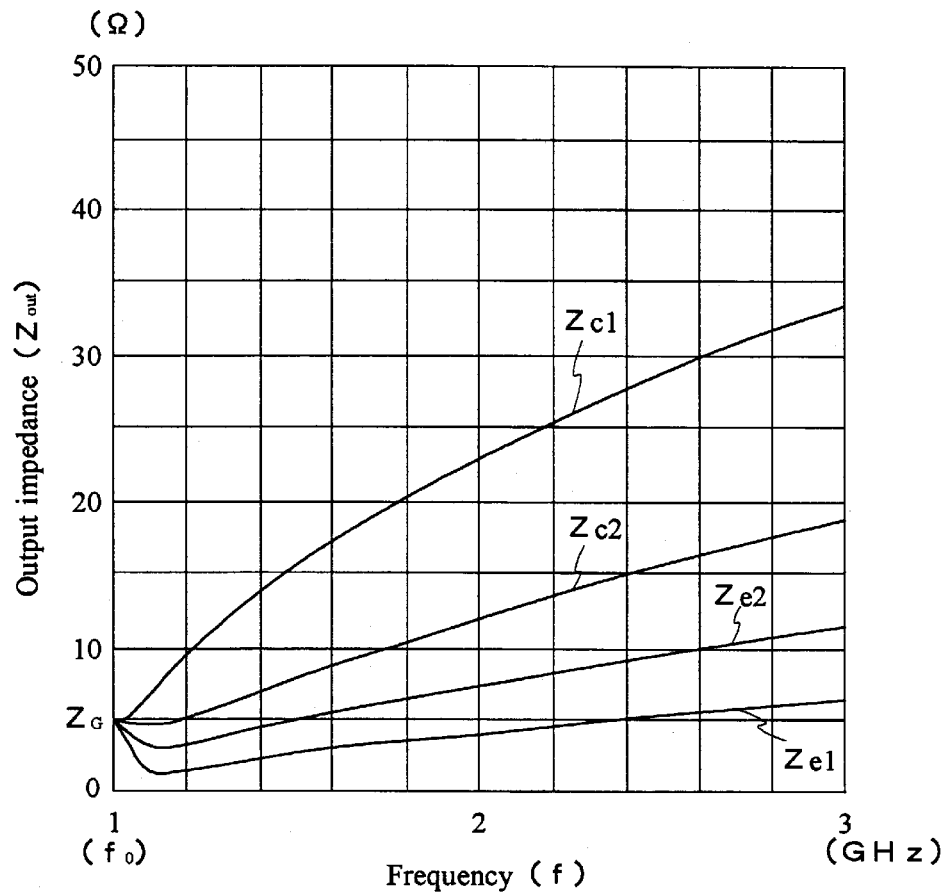
FIG. 17 is a graph showing the output impedance-frequency characteristics respectively of the input matching circuit in a conventional example as well as in a comparative example and of the input matching circuit in the third embodiment of the present invention.

Here, the specific circuit constants of the input matching circuit in the conventional example as well as a comparative example and of the input matching circuit 36 in the present embodiment are shown in FIG. 16, and the output impedance-frequency characteristics of the matching circuit when these circuit constants were bound are shown in FIG. 17 respectively.

Incidentally, when a probe, etc., of a measuring device is connected with an actually formed power amplifier module 10, there will appear a strong influence of floating capacity as well as inductor, etc. due to the probe, accurate measurement is not feasible since the power amplifier module 10 is a circuit to treat high-frequency signals. Thus, the output impedance-frequency characteristics obtained by simulation are shown in FIG. 17.

Figure 18:
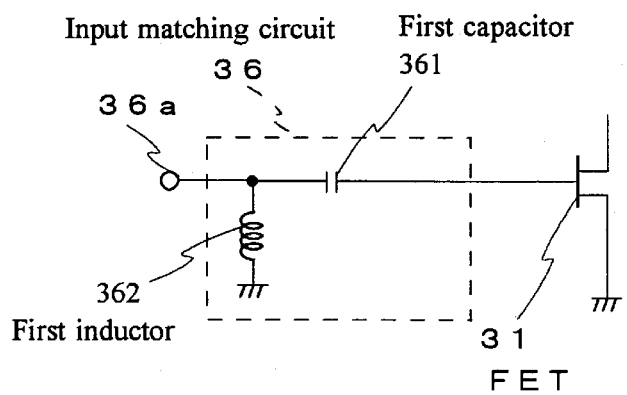
FIG. 18 is a circuit diagram showing an input matching circuit of a conventional example.

As for the conventional example, as shown in FIG. 18, a configuration excluded the second inductor 363, namely a matching circuit consisting of a first capacitor 361 and a first inductor 362 was given.

In addition, with C1 being the capacitance value of the first capacitor 361, L1 being the inductance value of the first inductor 362, and L2 being the inductance value of the second inductor 363, and as for a conventional example involving C1=10.2 pF, L1=2.8 nH, the matching between the not shown previous stage circuit (output impedance: 50Ω) and the gate of the FET 31 (input impedance: 5Ω) was secured at the frequency of the objective signal to be amplified ($f_o$=1 GHz).

In addition, as for the first example of the present embodiment, C1=15.5 pF, L1=1.3 nH, and L2=0.5 nH were given, and as for the second example, C1=1.0 pF, L1=2.0 nH, and L2=1.0 nH were given, and the matching was secured at the frequency of the objective signal to be amplified ($f_o$=1 GHz) respectively.

Moreover, as a comparative example, providing a circuit configuration similar to the present embodiment, only involving changes in circuit constants with C1=0.5 pF, L1=2.5 nH, and L2=2.0 nH and the matching was secured at the frequency of the objective signal to be amplified ($f_o$=1 GHz).

The matching circuit of the conventional example having the above-mentioned circuit constants had output impedance-frequency characteristics shown as $Z_{c1}$ curve in FIG. 17. That is, the output impedance ($Z_{out}$) is 5Ω at the frequency of the objective signal to be amplified ($f_o$1 GHz), and as the signal frequency (f) increases, the output impedance ($Z_{out}$) increases linearly, presenting approximately 23Ω at 2 GHz and approximately 33Ω at 3 GHz.

In contrast therewith, the matching circuit 36 of the first example has output impedance-frequency characteristics shown as $Z_{e1}$ curve in FIG. 17. That is, the output impedance ($Z_{out}$) is 5Ω at the frequency of the objective signal to be amplified ($f_o$=1 GHz), and at the neighborhood frequencies around 1 GHz, as the signal frequency (f) increases, the output impedance ($Z_{out}$) decreases, showing the minimum value (approximately 1.5Ω) at about 1.1 GHz, and thereafter, as the signal frequency increases, the output impedance ($Z_{out}$) increases approximately linearly, showing approximately 4Ω at 2 GHz and approximately 6Ω at 3 GHz.

The matching circuit 36 of the second example has output impedance-frequency characteristics shown as $Z_{e2}$ curve in FIG. 17. That is, the output impedance ($Z_{out}$) is 5Ω at the frequency of the objective signal to be amplified ($f_o$=1 GHz), and at the neighborhood frequencies around 1 GHz, as the signal frequency (f) increases, the output impedance ($Z_{out}$) decreases, showing the minimum value (approximately 3.5Ω) at about 1.1 GHz, and thereafter, as the signal frequency increases, the output impedance ($Z_{out}$) increases approximately linearly, showing approximately 7.5Ω at 2 GHz and approximately 12Ω at 3 GHz.

In addition, the matching circuit of the comparative example has output impedance-frequency characteristics shown as Zc2 curve in FIG. 17. That is, the output impedance ($Z_{out}$) is 5Ω at the frequency of the objective signal to be amplified ($f_o$=1 GHz), and at the neighborhood frequencies around 1 GHz, in spite that the signal frequency (f) increases, the output impedance ($Z_{out}$), stays at approximately constant value, and then at about 1.2 GHz and thereafter, as the signal frequency increases, the output impedance ($Z_{out}$) increases approximately linearly, showing approximately 12Ω at 2 GHz and approximately 19Ω at 3 GHz.

Also when a sine wave signal at 1 GHz was input for amplifier respectively to power amplifier modules having matching circuits of the above-mentioned example, as in the first embodiment, it was successfully confirmed that its waveform of an output signal represented the signal waveform sufficiently distinguishable as a sine wave of 1 ns ($1\times10^{-9}$ second) cycle in spite of its slight distortion, and the distortion was largely reduced compared with in the conventional example.

In addition, by way of the matching circuit 36 of the third embodiment, as presumable from the above-described comparative example, the first and second examples, since as the inductance values of the first and the second inductor 362, and 363 become smaller, a desired output impedance-frequency characteristics become more achievable, and, in the case where these first and second inductors 362 and 363 are formed with strip lines, the length thereof may be made very short and thus the circuit configuration may be sufficiently implemented also for the purpose of planning miniaturization of shape as well as high density in the high-frequency power amplifier module 10. For example, in the case where the second inductor 363 of the above-described first example was formed on an alumina substrate ($\epsilon$=9.6) with strip lines, the length thereof was approximately 3.2 mm.

Incidentally, in the input matching circuit 36 in the above-described configuration, as the inductance values of the first and the second inductor 362, and 363 are made smaller, the capacity value of the first capacitor 361 increases, where the capacity value ranges around from 10 to several 10 pF, and the size thereof rarely changes also in the case where a chip-shaped capacitor is used.

As mentioned above, according to a power amplifier module 10 of the present embodiment, at the frequency of the objective signal to be amplified (1 GHz) having been outputted from the previous stage circuit, the input impedance of the input matching circuit 36 becomes approximately equal to the output impedance of the previous stage circuit, and the output impedance of the matching circuit 36 becomes approximately equal to the gate input impedance of the FET 31, and therefore the objective signal to be amplified is inputted to the gate of the FET 31 in a well matched state without causing any attenuation, etc., and is amplified by FET 31 and is outputted.

Moreover, as for the input matching circuit 36, the output impedance ($Z_{out}$) shows the value not more than twice the gate input impedance ($Z_G$) of FET 31 for the entire frequencies from the frequency of the objective signals to be amplified to the frequency of the second higher harmonic wave of the objective signals to be amplified, thus the gate voltage generated by these noise component current at least in the above-mentioned frequency band including the second higher harmonic wave of the objective signals to be amplified is more largely reduced than that in the conventional case, and therefore power amplifier with less distortion can be provided. Moreover, since the electric power to be consumed for amplifying the noise component decreases compared with conventional cases, excellent effects such as reduction of consumption power, increase in maximum output power, and increase in drain efficiency for amplifier, etc. are also shown.

In addition, when a gate bias circuit is necessary with a coupling capacitor to remove the direct current to be provided between the previous stage circuit and the module, as described with the first embodiment, the second capacitor may be well provided between the second inductor 363 and the earth so that the direct bias current to be supplied from the gate bias circuit to the gate of FET 31 may not be short-circuited by the second inductor 363 of the input matching circuit 36. Also in this case, the circuit constants need to be fixed so that the output impedance-frequency characteristics of the input matching circuit 36 remain similar to the aforementioned.

Figure 19:
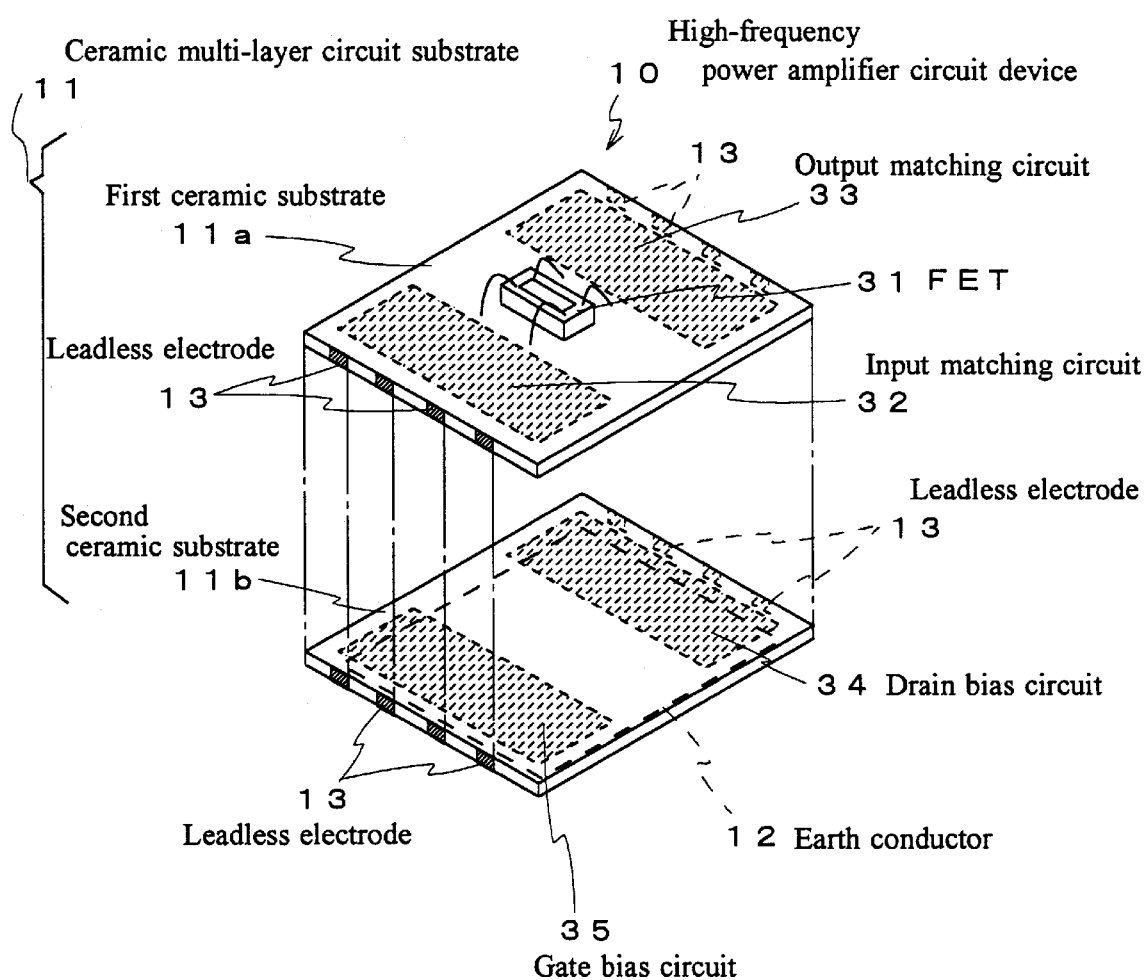
FIG. 19 is a schematic exploded perspective view showing a high-frequency power amplifier module of another embodiment of the present invention.

Incidentally, in the aforementioned first and second embodiments, as a configuration for a power amplifier module 10, as shown in FIG. 19, the gate bias circuit 35 is preferably formed onto the second ceramic substrate 11b so that it will be overlapped at the region where the input matching circuit 32 is formed on the first ceramic substrate 11a.

Figure 20:
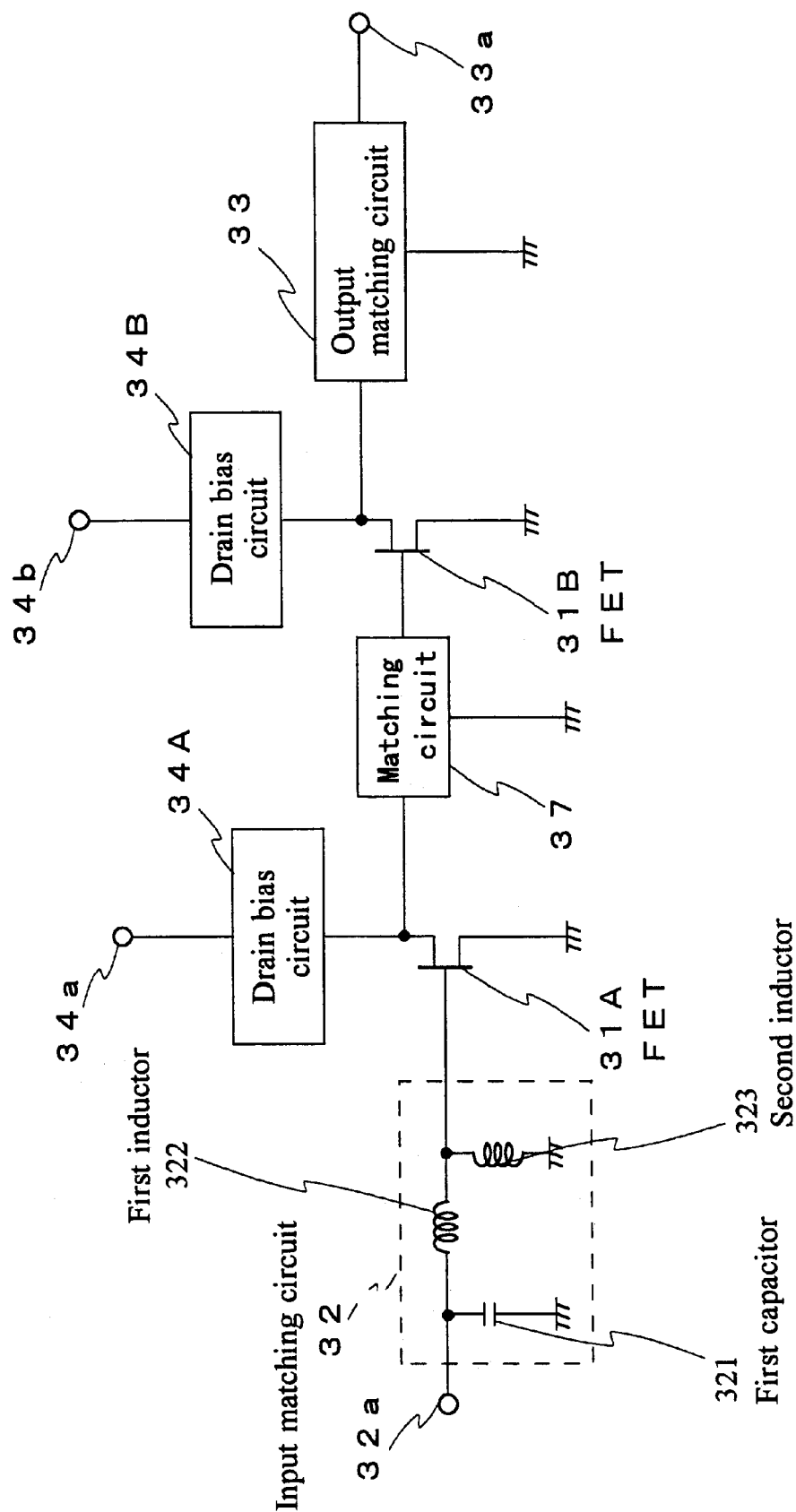
FIG. 20 is a circuit diagram showing a high-frequency power amplifier circuit of another embodiment of the present invention.

In addition, as shown in FIG. 20, also in the case where an increase in efficiency is planned with two-stage configuration of FET, the theory on the above-described input matching circuit 32 can be applied to the matching circuit 37 placed between two FETs 31a and 31B.

Figure 21:
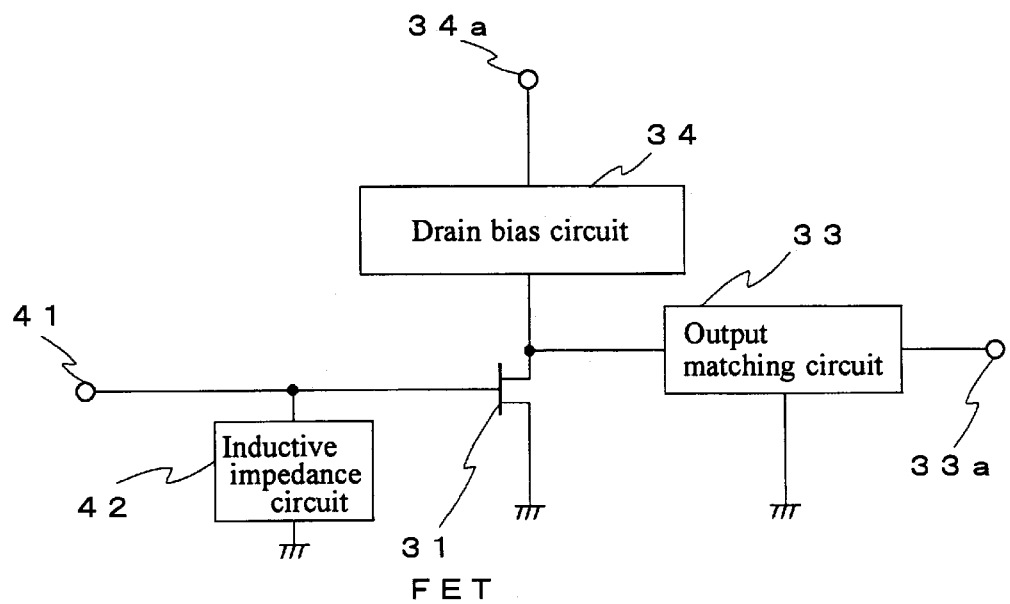
FIG. 21 is a circuit diagram showing a high-frequency power amplifier circuit of another embodiment of the present invention.

In addition, in the case where no input matching circuits are necessary, as shown in FIG. 21, similar effects are obtainable with the input terminal 41 being directly connected to the gate of FET 31 and with an inductive impedance circuit having the aforementioned impedance characteristics to be connected between the gate of FET 31 and the earth. Here, the impedance-frequency characteristics of the inductive impedance circuit 42 preferably show a value not more than twice the gate input impedance of the FET 31 at least for a frequency band from the frequency of the objective signal to be amplified to the frequency of the second higher harmonic wave except the frequency of the objective signal to be amplified which is put to the gate of the FET 31. Moreover, if the characteristics are arranged to have the impedance minimum point between the frequency of the objective signal to be amplified and its frequency of the second higher harmonic wave, the noise removing effect can be further increased.

Figure 22:
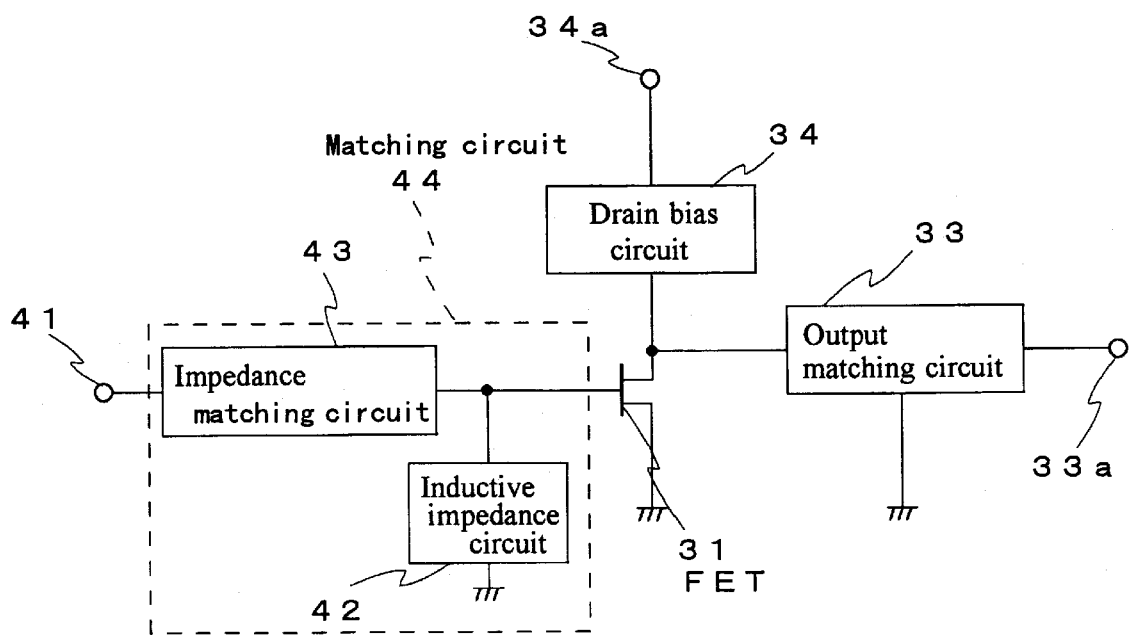
FIG. 22 is a circuit diagram showing a high-frequency power amplifier circuit of another embodiment of the present invention.

In addition, further to the one comprising an inductive impedance circuit as shown in FIG. 21, an impedance matching circuit 43 may be provided between the input terminal 41 and the gate of the FET 31 as shown in FIG. 22. In this case, it may well be possible to call a matching circuit 44 inclusive of the inductive impedance circuit 42 and the impedance matching circuit 43.

The above-described Prior Art, and the description of Means for solving the Problems and Embodiments of the Invention are deemed to be necessary as well as sufficient in order to explain the contents of the present invention to those skilled in the art. In addition, it goes without saying that the present invention shall not be limited only within the configurations of the above-described embodiments.

What is claimed is:

1. A high-frequency power amplifier adapted to be responsive to a source having a predetermined high-frequency and a predetermined output impedance comprising a first field effect transistor having (a) a gate electrode, (b) a source electrode and (c) an impedance between the gate and source electrodes, the impedance being substantially lower than the source output impedance so there is a substantial impedance mismatch between the source output impedance and the impedance between the gate and source electrodes, a first matching circuit for reducing the impedance mismatch between the source output impedance, and between the gate and source electrodes, the first matching circuit having (a) a first input terminal for connection to a first output terminal of the source, (b) a ground terminal for connection to a second output terminal of the source and connected to the source electrode, (c) a terminal connected to the gate electrode, and (d) an inductive impedance connected in a shunt branch having a terminal connected to the gate electrode, the first matching circuit having an output impedance value in a frequency band extending between the predetermined frequency and a frequency two times the predetermined frequency that does not exceed two times the impedance of the first field effect transistor between the gate and source electrodes thereof, and the first field effect transistor including a source drain path, a bias circuit for the source drain path connected to power the source drain path, the source drain path having (a) an output terminal at the drain thereof and (b) an output impedance between the source and drain thereof equal approximately to the output impedance of the source, a second field effect transistor having a gate source impedance equal approximately to the gate source impedance of the first field effect transistor, and a second matching circuit connected between the output terminal of the first field effect transistor and the gate electrode of the second field effect transistor, the second matching circuit having an output impedance between the gate and source electrodes of the second field effect transistor, the value of the second matching circuit output impedance in a frequency band extending between the predetermined frequency and a frequency two times the predetermined frequency that does not exceed two times the impedance of the second field effect transistor between the gate and source electrodes thereof.

2. The high-frequency power amplifier of claim 1 wherein the only impedance of the first matching circuit is the inductive impedance.

3. The high-frequency power amplifier of claim 2 wherein the inductive impedance has a minimum impedance value between the predetermined frequency and the frequency that is two times the predetermined frequency.

4. The high-frequency power amplifier of claim 1 wherein the first matching circuit includes a series branch connected between the first input terminal of the circuit and the terminal of the circuit connected to the gate electrode, the series branch including a reactance.

5. The high-frequency power amplifier of claim 4 wherein the reactance includes a DC blocking capacitor.

6. The high-frequency power amplifier of claim 5 wherein the reactance includes another inductive impedance.

7. The high-frequency power amplifier of claim 6 wherein the first matching circuit includes another shunt branch having one terminal connected between the capacitor and the another inductive impedance, the another shunt branch including a second capacitor.

8. The high-frequency power amplifier of claim 5 wherein the first matching circuit includes another shunt branch having one terminal connected to the circuit input terminal, the another shunt branch including another inductive impedance, the series branch including the DC blocking capacitor being connected between the circuit input terminal and the terminal of the circuit connected to the gate electrode.

9. The high-frequency power amplifier of claim 4 wherein the reactance includes another inductive impedance.

10. The high-frequency power amplifier of claim 9 wherein the first matching circuit includes another shunt branch having one terminal connected to the circuit input terminal, the another shunt branch including a second capacitor.

11. The high-frequency power amplifier of claim 1 further including a capacitor connected in series with the inductive impedance.

12. The high-frequency power amplifier of claim 1 further including a gate bias circuit having a terminal connected to the gate electrode.

13. The amplifier of claim 1 wherein the circuit and the gate and source electrodes are arranged so that the impedance shunting the gate electrode is dominated by the impedances of (a) the field effect transistor between the gate and source electrodes, and (b) the branch.

14. A high-frequency power amplifier adapted to be responsive to a source having a predetermined high-frequency and a predetermined output impedance comprising a first field effect transistor having (a) a gate electrode, (b) a source electrode and (c) an impedance between the gate and source electrodes, the impedance being substantially lower than the source output impedance so there is a substantial impedance mismatch between the source output impedance and the impedance between the gate and source electrodes, a first matching circuit for reducing the impedance mismatch between the source output impedance, and between the gate and source electrodes, the first matching circuit having (a) a first input terminal for connection to a first output terminal of the source, (b) a ground terminal for connection to a second output terminal of the source and connected to the source electrode, and (c) a terminal connected to the gate electrode, the first matching circuit having an output impedance value in a frequency band extending between the predetermined frequency and a frequency two times the predetermined frequency that does not exceed two times the impedance of the first field effect transistor between the gate and source electrodes thereof, the first field effect transistor including a source drain path, a bias circuit for the source drain path connected to power the source drain path, the source drain path having (a) an output terminal at the drain thereof and (b) an output impedance between the source and drain thereof equal approximately to the output impedance of the source, a second field effect transistor having a gate source impedance equal approximately to the gate source impedance of the first field effect transistor, and a second matching circuit connected between the output terminal of the first field effect transistor and the gate electrode of the second field effect transistor, the second matching circuit having an output impedance between the gate and source electrodes of the second field effect transistor, the second matching circuit having an output impedance value in a frequency band extending between the predetermined frequency and a frequency two times the predetermined frequency that does not exceed two times the impedance of the second field effect transistor between the gate and source electrodes thereof.

15. The high-frequency power amplifier of claim 14 wherein the inductive impedance has a minimum impedance value between the predetermined frequency and the frequency that is two times the predetermined frequency.

16. The high-frequency power amplifier of claim 14 wherein the circuit and the gate and source electrodes are arranged so that the impedance shunting the gate electrode is dominated by the impedances of (a) the field effect transistor between the gate and source electrodes, and (b) the branch.

17. The high-frequency power amplifier of claim 14 wherein the circuit and the gate and source electrodes are arranged so that the impedance shunting the gate electrode is dominated by the impedances of (a) the field effect transistor between the gate and source electrodes and (b) the inductive impedance.

18. A high-frequency power amplifier adapted to be responsive to a source having a predetermined high-frequency and a predetermined output impedance comprising a first field effect transistor having (a) a first gate electrode, (b) a first drain electrode, (c) a first source electrode and (d) a first impedance between the first gate and first source electrodes, the first impedance being substantially lower than the source output impedance so there is a substantial impedance mismatch between the source output impedance and the first impedance between the first gate and first source electrodes, a first matching circuit having (a) a first input terminal for connection to a first output terminal of the source, (b) a ground terminal for connection to a second output terminal of the source and connected to the first source electrode, (c) a terminal connected to the first gate electrode, and (d) a first inductive impedance connected in a first shunt branch having a terminal connected to the first gate electrode, the first inductive impedance having a value to cause the impedance shunting the first gate electrode to extend from an impedance value (Z) at the predetermined frequency to an impedance value that is no more than 2Z at a frequency twice the predetermined frequency.

19. The amplifier of claim 18 further including a second field effect transistor having (a) second gate electrode, (b) a second source electrode and (c) a second impedance between the second gate and second source electrodes, the second impedance being substantially lower than an output impedance between the first source and first drain electrodes so there is a substantial impedance mismatch between the output impedance between the first source and first drain of the first field effect transistor and the impedance between the second gate and second source electrodes of the second field effect transistor, a second matching circuit having (a) a first input terminal connected to an output terminal of the first field effect transistor, (b) a ground terminal connected to the second output terminal of the source and connected to the second source electrode of the second field effect transistor, (c) a terminal connected to the second gate electrode of the second field effect transistor, and (d) a second inductive impedance connected in a second shunt branch having a terminal connected to the second gate electrode of the second field effect transistor, the second inductive impedance having a value to cause the impedance shunting the second gate electrode of the second field effect transistor to extend from an impedance value (Z) at the predetermined frequency to an impedance value that is no more than 2Z at a frequency twice the predetermined frequency.

20. The high-frequency power amplifier of claim 19 wherein the first gate and first source electrodes have an impedance between them in the first field effect transistor substantially equal to Z, and the second gate and second source electrodes have an impedance between them in the second field effect transistor substantially equal to Z.

21. The high-frequency power amplifier of claim 18 wherein the first gate and first source electrodes have an impedance between them in the first field effect transistor substantially equal to Z.

22. A high-frequency power amplifier adapted to be responsive to a source having a predetermined high-frequency and a predetermined output impedance comprising a first field effect transistor having (a) a first gate electrode, (b) a first source electrode and (c) a first impedance between the first gate and first source electrodes, the first impedance being substantially lower than the source output impedance so there is a substantial impedance mismatch between the source output impedance and an impedance between the first gate and first source electrodes, a first matching circuit for reducing the impedance mismatch between the source output impedance and the impedance between the first gate and first source electrodes, a second field effect transistor having (a) a second gate electrode, (b) a second source electrode and (c) a second impedance between the second gate and second source electrodes, the second impedance being substantially lower than an output impedance between the first source and first drain electrodes so there is a substantial impedance mismatch between an output impedance of the first field effect transistor and the second impedance between the second gate and second source electrodes, a second matching circuit for reducing the impedance mismatch between the output impedance of the first field effect transistor and the impedance of the second gate and second source electrodes, the second matching circuit having (a) a first input terminal connected to an output terminal of the first field effect transistor, (b) a ground terminal connected to the second source electrode, (c) a terminal connected to the second gate electrode, and (d) an inductive impedance connected in a shunt branch having a terminal connected to the second gate electrode, the second matching circuit having an output impedance value in a frequency band extending between the predetermined frequency and a frequency two times the predetermined frequency that does not exceed two times the impedance of the second field effect transistor between the gate and source electrodes thereof.

23. The high-frequency power amplifier of claim 22 wherein the only impedance of the second matching circuit is the inductive impedance.

24. The high-frequency power amplifier of claim 23 wherein the inductive impedance has a minimum impedance value between the predetermined frequency and the frequency that is two times the predetermined frequency.

25. The high-frequency power amplifier of claim 22 wherein the second matching circuit includes a series branch connected between the first input terminal of the second matching circuit and the terminal of the circuit connected to the second gate electrode, the series branch including a reactance.

26. The high-frequency power amplifier of claim 25 wherein the reactance includes a DC blocking capacitor.

27. The high-frequency power amplifier of claim 26 wherein the reactance includes another inductive impedance.

28. The high-frequency power amplifier of claim 27 wherein the second matching circuit includes another shunt branch having one terminal connected between the capacitor and the another inductive impedance, the another shunt branch including a second capacitor.

29. The high-frequency power amplifier of claim 26 wherein the second matching circuit includes another shunt branch having one terminal connected to the second matching circuit input terminal, the another shunt branch including another inductive impedance, the series branch including the DC blocking capacitor, the DC blocking capacitor being connected between the second matching circuit input terminal and the terminal of the circuit connected to the second gate electrode.

30. The high-frequency power amplifier of claim 29 wherein the reactance includes another inductive impedance.

31. The high-frequency power amplifier of claim 30 wherein the second matching circuit includes another shunt branch having one terminal connected to the second matching circuit input terminal, the another shunt branch including a second capacitor.

32. The high-frequency power amplifier of claim 22 further including a capacitor connected in series with the inductive impedance.

33. The high-frequency power amplifier of claim 22 further including a gate bias circuit having a terminal connected to the second gate electrode.

34. The high-frequency power amplifier of claim 22 wherein the second matching circuit and the second gate and second source electrodes are arranged so that the impedance shunting the second gate electrode is dominated by the impedances of (a) the second field effect transistor between the second gate and second source electrodes, and (b) the branch.

* * * * *